(12) United States Patent
Lin et al.

(10) Patent No.: US 12,336,188 B2
(45) Date of Patent: Jun. 17, 2025

(54) TWO-DIMENSIONAL MATERIAL-BASED SELECTOR WITH STACK UNIT, MEMORY UNIT, ARRAY, AND METHOD OF OPERATING THE SAME

(71) Applicant: INSTITUTE OF MICROELECTRONICS, CHINESE ACADEMY OF SCIENCES, Beijing (CN)

(72) Inventors: Huai Lin, Beijing (CN); Guozhong Xing, Beijing (CN); Ming Liu, Beijing (CN)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 260 days.

(21) Appl. No.: 17/998,782

(22) PCT Filed: May 15, 2020

(86) PCT No.: PCT/CN2020/090618
§ 371 (c)(1),
(2) Date: Nov. 14, 2022

(87) PCT Pub. No.: WO2021/114571
PCT Pub. Date: Jun. 17, 2021

(65) Prior Publication Data
US 2023/0165014 A1 May 25, 2023

(51) Int. Cl.
*G11C 11/16* (2006.01)
*H10B 61/00* (2023.01)

(52) U.S. Cl.
CPC ........... *H10B 61/10* (2023.02); *G11C 11/161* (2013.01); *G11C 11/1659* (2013.01);
(Continued)

(58) Field of Classification Search
CPC ...... H10B 61/10; H10B 61/20; G11C 11/161; G11C 11/1659; G11C 11/1673; G11C 11/1675; H10N 50/10
See application file for complete search history.

(56) References Cited

U.S. PATENT DOCUMENTS

2006/0208304 A1* 9/2006 Lee ................... H10D 86/201
257/314
2014/0319634 A1* 10/2014 Shukh .................. G11C 11/161
257/427

(Continued)

FOREIGN PATENT DOCUMENTS

CN 103579238 A 2/2014
CN 105405860 A 3/2016
(Continued)

OTHER PUBLICATIONS

International Search Report and Written Opinion dated Feb. 22, 2021, for corresponding PCT Application No. PCT/CN2020/090618.

(Continued)

*Primary Examiner* — Mushfique Siddique
(74) *Attorney, Agent, or Firm* — Kinney & Lange, P.A.

(57) ABSTRACT

A two-dimensional material-based selector includes: a stack unit, wherein the stack unit has a metal-two-dimensional semiconductor-metal structure comprising a two-dimensional semiconductor layer, and metal layers arranged on an upper surface and a lower surface of the two-dimensional semiconductor layer, respectively. The number of the stack units is N, where N≥1. In each stack unit, a Schottky contact is formed on two metal-two-dimensional conductor interfaces, and the stack unit includes two Schottky diode structures connected in reverse series in response to the two-dimensional material-based selector being turned on. Alternatively, the number of the stack units is M, where (Continued)

M≥2. In each stack unit, a Schottky contact and an Ohmic contact are formed the two metal-two-dimensional conductor interfaces, respectively. The M stack units include M Schottky diode structures connected in reverse series in response to the two-dimensional material-based selector being turned on.

14 Claims, 9 Drawing Sheets

(52) U.S. Cl.
CPC ...... *G11C 11/1673* (2013.01); *G11C 11/1675* (2013.01); *H10B 61/20* (2023.02)

(56) References Cited

U.S. PATENT DOCUMENTS

| | | | |
|---|---|---|---|
| 2015/0249096 A1* | 9/2015 | Lupino | G11C 11/1675 257/203 |
| 2016/0204162 A1 | 7/2016 | Hu et al. | |
| 2017/0117027 A1* | 4/2017 | Braganca | H10B 61/10 |
| 2018/0122825 A1* | 5/2018 | Lupino | H10B 63/20 |
| 2019/0214429 A1 | 7/2019 | Kim et al. | |
| 2020/0075676 A1* | 3/2020 | Salahuddin | H10D 8/60 |
| 2020/0127046 A1* | 4/2020 | Lai | H10N 50/80 |
| 2021/0043683 A1* | 2/2021 | Chiang | G11C 11/1659 |

FOREIGN PATENT DOCUMENTS

| | | | | | |
|---|---|---|---|---|---|
| CN | 105449099 A | | 3/2016 | | |
| CN | 105848739 A | | 8/2016 | | |
| CN | 108493255 A | | 9/2018 | | |
| CN | 110660435 A | | 1/2020 | | |
| CN | 110676288 A | | 1/2020 | | |
| CN | 110660435 B | * | 9/2021 | ............ | G11C 16/06 |
| DE | 102019121676 A1 | * | 2/2021 | ............ | G11C 11/15 |

OTHER PUBLICATIONS

First Chinese Office Action dated Dec. 19, 2023, for corresponding Chinese Patent Application No. 202010416854.3, 8 pgs.

* cited by examiner

TWO-DIMENSIONAL MATERIAL-BASED SELECTOR WITH STACK UNIT, MEMORY UNIT, ARRAY, AND METHOD OF OPERATING THE SAME

CROSS REFERENCE TO RELATED APPLICATION

This application is a Section 371 National Stage Application of International Application No. PCT/CN2020/090618, filed on May 15, 2020, entitled "TWO-DIMENSIONAL MATERIAL-BASED SELECTOR, MEMORY UNIT, ARRAY, AND METHOD OF OPERATING THE SAME", the whole disclosure of which is incorporated herein by reference in its entirety.

TECHNICAL FIELD

The present disclosure belongs to a field of storage technology, and in particular to a two-dimensional material-based selector, memory unit, array, and method of operating the same.

BACKGROUND

Magnetic Random Access Memory (MRAM) is a new type of non-volatile memory. A core portion of a MRAM is a Magnetic Tunnel Junction (MTJ). The MTJ consists of a ferromagnetic material-based reference layer, a free layer, and a high-quality oxide tunneling barrier layer between the two. When magnetization directions between the reference layer and the free layer are anti-parallel, the MTJ exhibits a high resistance state "1"; and when the magnetization directions of the reference layer and the free layer are parallel, the MTJ exhibits a low resistance state "0", so that the change of the high resistance state and the low resistance state of the MTJ is completed by driving the free layer to switch the magnetization direction, so as to achieve the storage of information. Compared with a traditional Static Random Access Memory (SRAM), the MRAM has a smaller volume and a lower leakage, so that a static power consumption may be reduced, and compared with a Dynamic Random Access Memory (DRAM), the MRAM has a faster read and write operation speed and non-volatility, and the MRAM also has advantages of higher reading and writing times, compatibility with existing integrated circuit process, radiation resistance and the like.

According to the information storage mechanism, the current MRAM has three data writing modes. The earliest technology is magnetic field writing to MARM, which uses an Oersted field generated by a pulse current to realize the magnetization switching of the free layer, so as to realize the storage of the required information. However, the technical problems of this method are that the required pulse current is large, the access speed is slow, and it is difficult to integrate, so that it is difficult to meet requirements of modern information devices. In the existing Spin Transfer Torque MRAM (STT-MRAM), an electron spin injection is performed by a polarized current, and an information writing is completed by driving the free layer to switch the magnetization direction based on spin transfer torque, which may significantly reduce the device size, reduce the power consumption and improve the speed, and may be particularly applied to the aspect of high-performance embedded storage. In 2012, researchers proposed a concept of Spin-Orbit Torque MRAM (SOT-MRAM), is which a spin injection is realized by a spin-orbit coupling effect, and the material in the free layer is driven to switch the magnetization direction. The method separates a data writing path from a data reading path. In principle, the method may further reduce the power consumption, and improve the data writing speed, data reading and writing times. However, the SOT-MRAM memory unit with a three-terminal structure requires a larger unit area, which is not favorable for high density integration of the memory. Therefore, it is temporarily impossible to realize large-capacity storage, which has become one of main obstacles that currently limit the development of the SOT-MRAM.

Therefore, based on the advantages and disadvantages of the three data writing modes described above, the information writing by using the STT-MRAM is still widely adopted in the manufacturing of the MRAM devices. The STT-MRAM is also an industry recognized memory solution most closely to replace the Flash memory. However, the STT-MRAM also has problems that integration density is low and power consumption needs to be optimized. On the other hand, the existing memory array has a leakage current problem. When a memory unit in an array is selected, unselected memory units located on the same bit line or word line as the selected memory unit are in a half-bias state with a large leakage current.

In order to increase a storage density while reducing a leakage current of a cross array device in use, researchers generally connect a selector in series with the memory unit, the selector is generally a conventional transistor, a conventional diode, a conventional ovonic threshold switch, etc. However, traditional silicon-based transistors and diodes have defects of large sizes, complex processes, high temperature limits of threshold modulation and the like, and are not favorable for high density integration. In addition to the same high temperature reliability problems as a conventional Ovonic Threshold Switching (OTS) selector, a chalcogenide ovonic threshold switching has a large thickness and a low mobility, which may affect the storage speed; an on-resistance of a variable-resistance type selector, such as a mixed ion-electron conductor (MIEC) selector and a field-assisted superlinear threshold (FAST) selector, is too high to be effectively matched and compatible with the existing MTJ, thereby being limited to be applied to the high density integrated STT-MRAM.

Therefore, it would be beneficial to provide a three-dimensional integrated structure of a memory configured with a new type of selector, which may have the high speed, the low power consumption and the high density, and may reduce the leakage current.

SUMMARY

The present disclosure provides a two-dimensional material-based selector, memory unit, array and method of operating the same to at least partially solve the problem described above.

According to a first aspect of the present disclosure, a two-dimensional material-based selector is provided, including: a stack unit, wherein the stack unit has a metal-two-dimensional semiconductor-metal structure comprising a two-dimensional semiconductor layer, and metal layers arranged on an upper surface and a lower surface of the two-dimensional semiconductor layer, respectively; wherein the stack unit comprises two Schottky diode structures connected in reverse series in response to the two-dimensional material-based selector being turned on.

In an embodiment of the present disclosure, the two-dimensional material-based selector comprises N stack units, where N≥1, and at least two stack units are stacked in a first direction perpendicular to a plane on which the two-dimensional semiconductor material layer is located in response to N≥2.

According to a second aspect of the present disclosure, a two-dimensional material-based selector is provided, including: M stack units, where M≥2, wherein each stack unit has a metal-two-dimensional semiconductor-metal structure comprising a two-dimensional semiconductor layer, and metal layers arranged on an upper surface and a lower surface of the two-dimensional semiconductor layer, respectively; wherein in each stack unit, an Ohmic contact is formed on a metal-two-dimensional semiconductor interface, and a Schottky contact is formed on a metal-two-dimensional semiconductor interface; wherein the M stack units are arranged in a second direction parallel to a plane on which the two-dimensional semiconductor layer is located, an insulation layer is arranged between sidewalls of two adjacent stack units in the M stack units, and the M stack units comprise M Schottky diode structures connected in reverse parallel in response to the two-dimensional material-based selector is turned on.

In an embodiment of the present disclosure, a material of the two-dimensional semiconductor layer comprises one or a combination of WS2, WSe2 and MoS2.

In an embodiment of the present disclosure, the two-dimensional semiconductor layer has a thickness of 2 nm to 10 nm.

In an embodiment of the present disclosure, a material of the metal layer is a simple substance formed by one of Pt, Ta, W, Ir, Os, Re, Hf, Pd, Rh, Mo, Nb, Zr, Au, Tc, Cd, Pb and Sn, or an alloy formed by a plurality of materials selected from Pt, Ta, W, Ir, Os, Re, Hf, Pd, Rh, Mo, Nb, Zr, Au, Tc, Cd, Pb and Sn.

In an embodiment of the present disclosure, a volt-ampere characteristic curve of the two-dimensional material-based selector is symmetrical, and has an ovonic conducting switching characteristic.

In an embodiment of the present disclosure, the two-dimensional material-based selector has a turn-on voltage of 0.8 V to 1.2 V.

In an embodiment of the present disclosure, the two-dimensional material-based selector has an on/off ratio not less than $10^3$.

In an embodiment of the present disclosure, the two-dimensional material-based selector has a turn-on current density not less than $10^6$ A/cm2.

According to a third aspect of the present disclosure, a memory unit is provided, including: the two-dimensional material-based selector mentioned above; and a magnetic tunnel junction; wherein the two-dimensional material-based selector and the magnetic tunnel junction are stacked in a first direction to form a selection storage unit comprising a first surface and a second surface oppositely arranged in the first direction, the first surface is configured to be connected with a word line, and the second surface is configured to be connected with a bit line.

In an embodiment of the present disclosure, the two-dimensional material-based selector is located above or below the magnetic tunnel junction in the first direction.

According to a fourth aspect of the present disclosure, a memory array is provided, including: at least one layer of cross storage array, wherein each layer of cross storage array comprises: a bit line array comprising a plurality of bit lines arranged in parallel in a second direction; a word line array comprising a plurality of word lines arranged in parallel in a third direction perpendicular to the first direction, wherein an included angle is formed between the third direction and the second direction; a plurality of memory units arranged at intersections of the word line array and the bit line array, wherein each memory unit of the plurality of memory units is the memory unit mentioned above.

In an embodiment of the present disclosure, the memory array further includes a selection transistor connected in series with each word line of the plurality of word lines in each layer of cross storage array, and is configured to control an on-off of the corresponding word line.

In an embodiment of the present disclosure, an insulation layer is arranged between two adjacent layers of cross storage array in the plurality of layers of cross storage array in response to the memory array comprising a plurality of layers of cross storage array.

According to a fifth aspect of the present disclosure, a method of operating the memory unit mentioned above is provided, including: applying a first voltage to the first surface of the selection storage unit and applying a second voltage to the second surface of the selection storage unit, wherein a value of a voltage drop generated by the first voltage and the second voltage on the selection storage unit is greater than a voltage value of a turn-on voltage of the two-dimensional material-based selector, so that at least one of a read operation and a write operation is performed on the magnetic tunnel junction.

In an embodiment of the present disclosure, a value of the voltage drop for performing the write operation is greater than a value of the voltage drop for performing the read operation.

According to a sixth aspect of the present disclosure, a method of operating the memory array mentioned above is provided, including: positioning a selection storage unit to be operated; applying a first voltage V1 to a word line on which the selection storage unit to be operated is located, and applying a second voltage V2 to a bit line on which the selection storage unit to be operated is located; and applying a zero voltage to a remaining word line and a remaining bit line; wherein a value of a voltage drop generated by the first voltage V1 and the second voltage V2 on the selection storage unit to be operated is greater than a voltage value of a turn-on voltage Von of the two-dimensional material-based selector, so that at least one of a write operation and a read operation is performed on the magnetic tunnel junction in the selection storage unit to be operated; a voltage value of the first voltage is less than or equal to Von/2 and a voltage value of the second voltage are less than or equal to Von/2, so that a voltage drop on other selection storage units located on the same word line or the same bit line as the selection storage unit to be operated meets: enabling two-dimensional material-based selectors in the other selection storage units to be in an off state.

According to a fifth aspect of the present disclosure, a value of the voltage drop for performing the write operation is greater than a value of the voltage drop for performing the read operation.

REFERENCE NUMERALS

Figure 1:
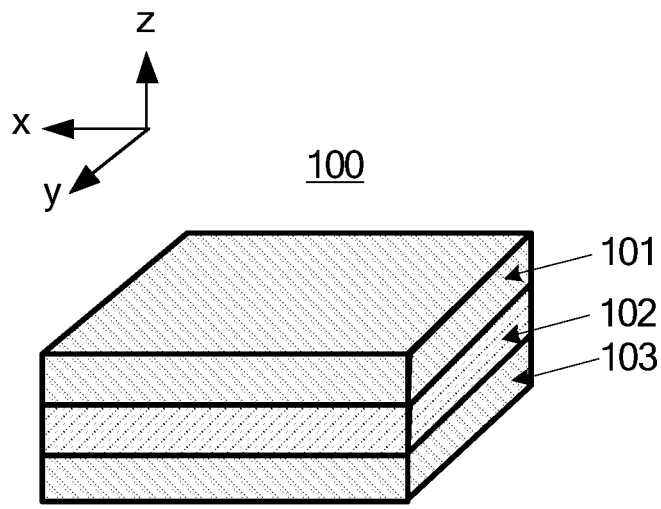
FIG. 1 is a schematic structural diagram of a two-dimensional material-based selector according to an embodiment of the present disclosure.

10—first memory unit;
100—first selector;
101—first metal layer;
102—two-dimensional semiconductor layer;
103—second metal layer;
100a—first metal-two dimensional semiconductor interface;
100b—second metal-two dimensional semiconductor interface;
200—magnetic tunnel junction;
201—reference layer;
202—a tunneling barrier layer;
203—free layer;
300—bit line;
400—word line;
11—second memory unit;
110—second selector;
111—first stack unit;
1111—third metal layer;
1112—first two-dimensional semiconductor layer;
1113—fifth metal layer;
112—second stack unit;
1121—fourth metal layer;
1122—second two-dimensional semiconductor layer;
1123—sixth metal layer;
113—insulation layer;
20—two-dimensional memory array;
310—bit line array;
311—first bit line;
312—second bit line;
313—third bit line;
410—word line array;
411—first word line;
412—second word line;
413—third word line;
510—selection transistor;
511—first selection transistor;
512—second selection transistor;
513—third selection transistor;
30—three-dimensional memory array;
20a—first two-dimensional memory array;
20b—second two-dimensional memory array;
20c—third two-dimensional memory array.

DETAILED DESCRIPTION OF EMBODIMENTS

In order to make objectives, technical solutions and advantages of the present disclosure more apparent, the present disclosure will be further described in detail below with reference to specific embodiments and the accompanying drawings.

The embodiments of the present disclosure provide a two-dimensional material-based selector, including: a stack unit, wherein the stack unit has a metal-two-dimensional semiconductor-metal structure including: a two-dimensional semiconductor layer and metal layers arranged on an upper surface and a lower surface of the two-dimensional semiconductor layer, respectively; in which a number of the stack units is N, where N≥1; in each stack unit, a Schottky contact is formed on two metal-two-dimensional semiconductor interfaces, and the stack unit includes two Schottky diode structures connected in reverse series when the two-dimensional material-based selector is turned on; or the number of the stack units is M, where M≥2; in each stack unit, the Schottky contact is formed on one of the two metal-two-dimensional semiconductor interfaces, an Ohmic contact is formed on the other one of the two metal-two-dimensional semiconductor interfaces, and the M stack units include M Schottky diode structures connected in reverse series when the two-dimensional material-based selector is turned on. The embodiments of the present disclosure provide a memory unit including: the two-dimensional material-based selector described above and a magnetic tunnel junction; wherein the two-dimensional material-based selector and the magnetic tunnel junction are stacked in a first direction to form a select storage unit including a first surface and a second surface opposite in the first direction, the first surface is used for connecting with a word line, and the second surface is used for connecting with a bit line.

A first exemplary embodiment of the present disclosure provides a two-dimensional material-based selector.

FIG. 1 is a schematic structural diagram of a two-dimensional material-based selector according to an embodiment of the present disclosure. For ease of description, the two-dimensional material-based selector of the present embodiment is referred to as a first selector, and a selector to be described later in another embodiment is referred to as a second selector.

Referring to FIG. 1, a first selector 100 of the present embodiment includes: a stack unit. A stack unit is illustrated in FIG. 1, and more numbers of stack units may be provided in the same manner, and a corresponding circuit may be equivalent to a series circuit of a plurality of stack units. The stack unit may have a metal-two-dimensional semiconductor-metal (M-S-M) structure, including: a two-dimensional semiconductor layer, and metal layers arranged on an upper surface and a lower surface of the two-dimensional semiconductor layer, respectively.

Referring to the structure shown in FIG. 1, the stack unit includes: a two-dimensional semiconductor layer 102, a first metal layer 101 arranged above the two-dimensional semiconductor layer 102, and a second metal layer 103 arranged below the two-dimensional semiconductor layer 102.

Electrical characteristics of each stack unit will be described with reference to FIGS. 2(*a*) and 2(*b*) together with FIG. 3.

Figure 2:
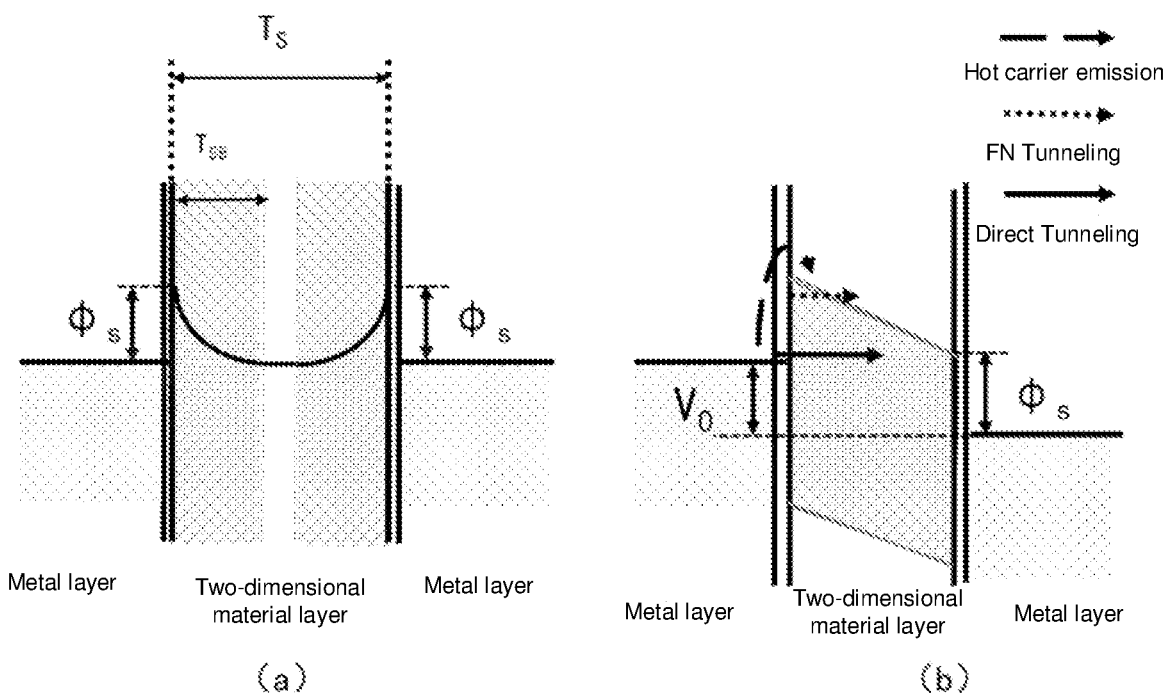
FIG. 2 is an energy band diagram of a metal-two-dimensional semiconductor-metal structure according to an embodiment of the disclosure, in which (a) is an energy band diagram when no bias voltage is applied; (b) is an energy band diagram when a voltage is applied.

FIG. 2 is an energy band diagram of a metal-two-dimensional semiconductor-metal structure according to an embodiment of the present disclosure, wherein FIG. 2(*a*) is an energy band diagram when no bias voltage is applied, and FIG. 2(*b*) is an energy band diagram when a voltage is applied.

Referring to FIG. 2(*a*), when no bias voltage is applied to the M-S-M structure, the metal layer is in contact with the two-dimensional semiconductor layer (which may be simply referred to as a two-dimensional material layer in some descriptions herein for simplicity of description), a Schottky barrier may be generated at a contact interface between the metal and the two-dimensional material layer due to a work function difference $\phi_S$ between the metal and the two-dimensional material layer. Two Schottky barriers are formed in a M-S-M structure. A dimension of a barrier width is denoted by $T_{SB}$, and a thickness of the two-dimensional material layer is denoted by $T_S$, where the thickness $T_S$ of the two-dimensional material layer is equivalent to twice the barrier width $T_S$. In order to highlight a dimensional relationship described above, the two-dimensional material layer is divided and illustrated in two portions in FIG. 2(*a*). When an applied voltage is zero or the voltage is low, the M-S-M structure may be regarded as being in an off state where no current flows.

Referring to FIG. 2(*b*), when a voltage $V_0$ is applied to the M-S-M structure, an energy band of the two-dimensional material layer in the M-S-M structure will be bent, so that a conduction band on a right side of the two-dimensional material layer is lowered to a position aligned with an energy level of the metal layer on a left side of the two-dimensional material layer. For example, a positive and negative direction of the applied voltage $V_0$ corresponding to the band bending situation shown in FIG. 2(*b*) is positive on the right side and negative on the left side, and the left and right here may refer to the directions in FIG. 2(*b*).

There are three current generating modes in the M-S-M structure described above. One current generating mode is: a hot carrier emission effect caused by carriers crossing the Schottky barrier layer under an action of the voltage $V_0$, and the other two current generating modes are: the energy band in the semiconductor layer is bent under the action of the voltage $V_0$, thereby resulting in a Fowler-Nordheim tunneling (F-N Tunneling), and a tunneling effect dominated by direct tunneling.

According to the embodiment of the present disclosure, the two-dimensional material-based selector may include N stack units, where N≥1. When the number N of the stack units included in the two-dimensional material-based selector is ≥2, at least two stack units are stacked in a first direction perpendicular to a plane on which the two-dimensional semiconductor material layer is located. That is, when the N stack units are stacked on the plane perpendicular to the plane on which the two-dimensional semiconductor layer is located, the N stack units are connected in series in sequence after the two-dimensional material-based selector is turned on.

Figure 10:
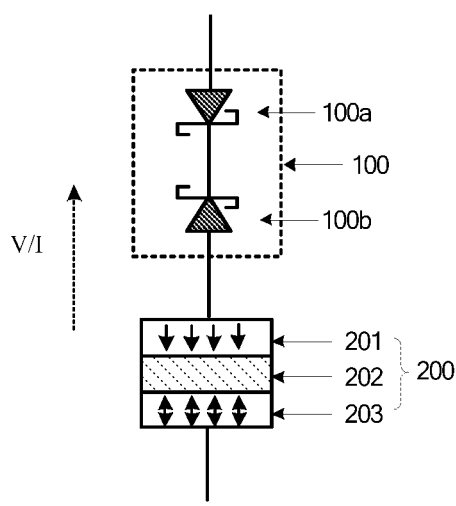
FIG. 10 is an equivalent circuit diagram of a two-dimensional material-based selector after being turned on according to an embodiment of the disclosure.

Each stack unit includes two Schottky diode structures connected in reverse series inside each stack unit when the two-dimensional material-based selector is turned on. Referring to FIG. 1 and FIG. 10, FIG. 10 shows an equivalent circuit after the two-dimensional material-based selector is turned on, and the metal-two-dimensional semiconductor-metal structure in each stack unit has two metal-two-dimensional semiconductor interfaces, which are respectively an interface formed by the first metal layer 101 and the two-dimensional semiconductor layer 102, and an interface formed by the second metal layer 103 and the two-dimensional semiconductor layer 102, and the two interfaces are respectively depicted as a first metal-two-dimensional semiconductor interface 100*a* and a second metal-two-dimensional semiconductor interface 100*b* in FIG. 10. Referring to FIG. 10, the first metal-two-dimensional semiconductor interface 100*a* and the second metal-two-dimensional semiconductor interface 100*b* are equivalent to two Schottky diodes connected in reverse series when the first selector 100 is turned on. Therefore, each stack unit may include two Schottky diode structures connected in reverse series when the two-dimensional material-based selector is turned on.

The condition of stacking a plurality of stack units may be deduced in a form of series connection. Certainly, the number of the stack units may be optimized according to actual conditions, and an excessive number of the stack units may cause a reduction in a switching performance.

In an embodiment, adjacent metal layers of each of the two adjacent stack units may also be served by one same metal layer. For example, two stack units may have a structure of metal layer-two-dimensional semiconductor layer-metal layer-metal layer-two-dimensional semiconductor layer-metal layer, or a structure of metal layer-two-dimensional semiconductor layer-metal layer-two-dimensional semiconductor layer-metal layer.

In an embodiment of the present disclosure, a material of the two-dimensional semiconductor layer includes one or a combination of $WS_2$, $WSe_2$ and $MoS_2$. For example, the material of the first two-dimensional semiconductor layer 102 is $WS_2$, and a material of the second two-dimensional semiconductor layer 104 is $WSe_2$.

In an embodiment of the present disclosure, a thickness of the two-dimensional semiconductor layer is adjustable between 2 nm and 10 nm. For example, it may be 3 nm, 4 nm, 5 nm, 6 nm, 8 nm, and the like. In an embodiment of the present disclosure, a material of the metal layer is a simple substance formed by one of Pt, Ta, W, Ir, Os, Re, Hf, Pd, Rh, Mo, Nb, Zr, Au, Tc, Cd, Pb and Sn or an alloy formed by a plurality of materials selected from Pt, Ta, W, Ir, Os, Re, Hf, Pd, Rh, Mo, Nb, Zr, Au, Tc, Cd, Pb and Sn.

Figure 3:
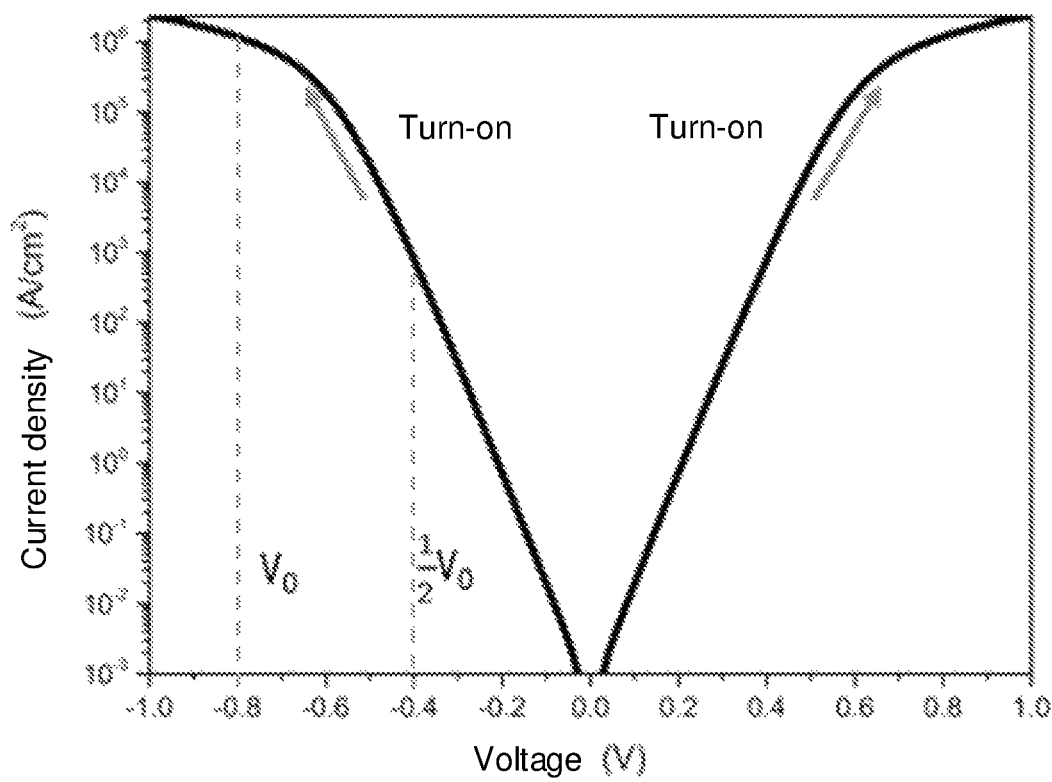
FIG. 3 is a volt-ampere characteristic curve of a two-dimensional material-based selector according to an embodiment of the present disclosure.

FIG. 3 is a volt-ampere characteristic curve of a two-dimensional material-based selector in accordance with an embodiment of the present disclosure.

As shown in FIG. 3, in the embodiment, a volt-ampere characteristic curve of a two-dimensional material-based selector including a stack unit is symmetrical, and the two-dimensional material-based selector has ovonic conducting switching characteristics. Referring to FIG. 3, the volt-ampere characteristic curve corresponding to an applying of a positive voltage and a negative voltage is symmetrical, and the volt-ampere characteristic curve at one side is taken as an example for description. As shown in an arc in FIG. 3, a current density passing through the two-dimensional material-based selector is gradually increased in response to a value of the applied negative voltage being gradually increased, a half bias voltage for a selector operation is reached, which is indicated by $V_0/2$ in FIG. 3, and the current density at this point is $10^3$ A/cm$^2$. Then, as the value of the voltage is gradually increased, the current density of the current passing through the two-dimensional material-based selector is continuously increased until an inflection point is reached, which is indicated by an intersection point of a straight line corresponding to $V_0$ and the volt-ampere characteristic curve in FIG. 3, wherein a process of increasing the current density is indicated by a straight line with a larger slope in FIG. 3, the current density at this point is about $10^6$ A/cm$^2$, and the straight line corresponds to an turn-on process of the two-dimensional material-based selector. After the two-dimensional material-based selector is turned on, a magnitude of the increase in the current density of the current passing through the two-dimensional material-based selector decreases as the voltage value is increased gradually, as indicated by a straight line segment with a smaller slope in FIG. 3. A voltage when the selector is switched from an initial high resistance state to a low resistance state is defined as a threshold voltage, the threshold voltage ($V_0/2$) in the present embodiment is less than 0.3 V, and the smaller the threshold voltage, the better the device performance. A turn-on voltage (also referred to as a working voltage) of the selector is a voltage corresponding to the selector current reaching a specific value or more (after being turned on stably), which is $V_0$ in the present embodiment, and the corresponding current density of the selector may reach $10^6$ A/cm$^2$.

Through experimental tests, the turn-on voltage of the two-dimensional material-based selector may be any value between 0.8 V and 1.2 V, including end point values. An on-off ratio of the two-dimensional material-based selector is not less than $10^3$. In an embodiment of the present disclosure, the turn-on current density of the two-dimensional material-based selector is not less than $10^6$ A/cm$^2$.

The two-dimensional material-based selector of the present embodiment has ovonic conducting switching characteristics and may be applied for read and write operations of a STT-MRAM. In some embodiments, the two-dimensional material-based selector described above has a minimum threshold voltage of 0.3 V, a high on-off ratio ($\geq 10^3$), and a high turn-on slope ($\geq 2$ mV/dec), thus shows a better performance.

A second exemplary embodiment of the present disclosure provides a memory unit. For ease of description, the memory unit of the present embodiment is referred to as a first memory unit, and a memory unit to be described later in another embodiment is referred to as a second memory unit.

Figure 4:
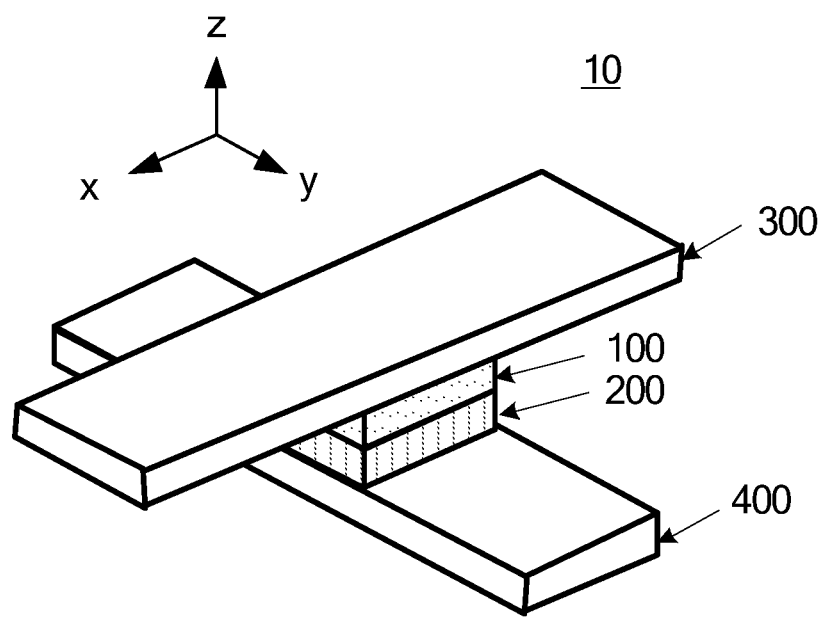
FIG. 4 is a schematic structural diagram of a memory unit according to an embodiment of the present disclosure.

FIG. 4 is a schematic structural diagram of a memory unit according to an embodiment of the present disclosure.

Referring to FIG. 4, the first memory unit 10 includes: a two-dimensional material-based selector, and the two-dimensional material-based selector in the present embodiment is the first selector 100 shown in the first embodiment; and a magnetic tunnel junction 200. The first selector 100 and the magnetic tunnel junction 200 are stacked in the first direction (z direction) to form a selection storage unit, and an on-off of the first selector 100 in the selection memory unit may be used to control a read operation and a write operation of the magnetic tunnel junction 200. The selection storage unit includes a first surface (corresponding to a lower surface in FIG. 4) and a second surface (corresponding to an upper surface in FIG. 4) oppositely arranged in the first direction, the first surface is used for connecting with a word line 400, and the second surface is used for connecting with a bit line 300.

In some embodiments, the first memory unit 10 may also be a structure including the bit line 300 and the word line 400.

Figure 5:
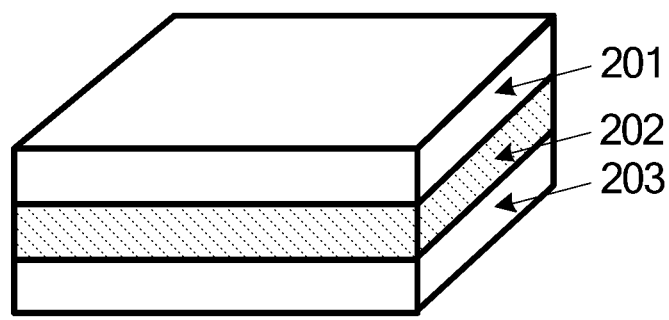
FIG. 5 is a schematic structural diagram of a magnetic tunnel junction according to an embodiment of the present disclosure.

The magnetic tunnel junction 200 described above may be a magnetic tunnel junction in the prior art. FIG. 5 is a schematic structural diagram of a magnetic tunnel junction according to an embodiment of the present disclosure. In an exemplary embodiment, referring to FIG. 5, the magnetic tunnel junction 200 includes: a reference layer 201 formed of a ferromagnetic material, a barrier layer 202, and a free layer 203 whose magnetic moment may be switched, the free layer 203 is used to store information. The reference layer 201 formed of the ferromagnetic material has an easy magnetization axis in the first direction (alternatively referred to as in a direction perpendicular to a film plane), which may facilitate a miniaturization of the device.

The word line 400 may be composed of a ferromagnetic metal composite layer, and may include a pinning layer and a pinned layer formed of a ferromagnetic metal, and a material of the ferromagnetic metal may include one or more of CoFeB, CoFe$_2$Al and Heusler alloy compounds such as Mn$_3$Ga.

In the schematic diagram shown in FIG. 4, the two-dimensional material-based selector being located above the magnetic tunnel junction is taken as an example. However, the present disclosure is not limited this. In the memory unit of the embodiments of the present disclosure, the two-dimensional material-based selector may be located above or below the magnetic tunnel junction in the first direction.

Under the turn-on voltage $V_0$, the two-dimensional material-based selector of the memory unit described above may be switched from an off state to an on state, and may have a current density greater than $10^6$ A/cm$^2$ (which may reach $10^7$ A/cm$^2$), and may realize quick read and write operations of the STT-MRAM. In the off state, the two-dimensional material-based selector described above has a current density greater of $10^3$ A/cm$^2$, an on-off ratio greater than $10^3$, and has excellent ovonic conducting switching characteristics.

A third exemplary embodiment of the present disclosure provides a method of operating a memory unit. The method of operating the memory unit of the present embodiment includes: applying a first voltage to the first surface of a selection storage unit and applying a second voltage to a second surface of the selection storage unit, wherein a value of a voltage drop generated by the first voltage and the second voltage on the selection storage unit is greater than a voltage value of a turn-on voltage of the two-dimensional material-based selector, so that at least one of the read operation and the write operation is performed on the magnetic tunnel junction.

In the method of operating the memory unit described above, a value of the voltage drop for performing the write operation is greater than a value of the voltage drop for performing the read operation.

Performing operations on the first memory unit shown in the second embodiment is taken as an example below.

Figure 6:
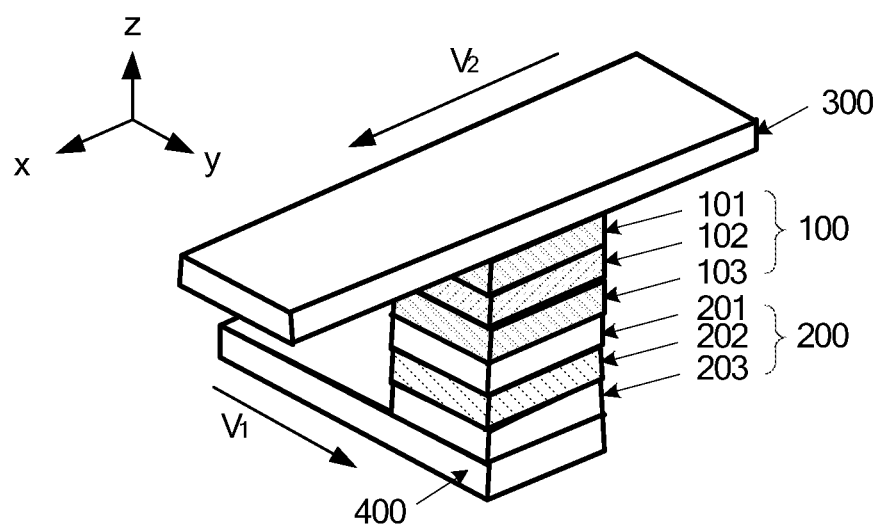
FIG. 6 is a schematic diagram of performing an operation on a memory unit according to an embodiment of the present disclosure.

The first memory unit 10 includes: the first selector 100; and the magnetic tunnel junction 200. The first selector 100 and the magnetic tunnel junction 200 are stacked in the first direction (z direction) to form a selection memory unit. FIG. 6 is a schematic diagram of performing an operation on the memory unit according to an embodiment of the present disclosure. Referring to FIG. 6, a first voltage $V_1$ is applied to the word line 400 and a second voltage $V_2$ is applied to the bit line 300, directions in which the first voltage and the second voltage are applied shown in FIG. 6 are exemplary only.

A process corresponding to performing the read and write operations on the memory unit shown in FIG. 6 is described below with reference to FIG. 7 to FIG. 9.

Figure 7:
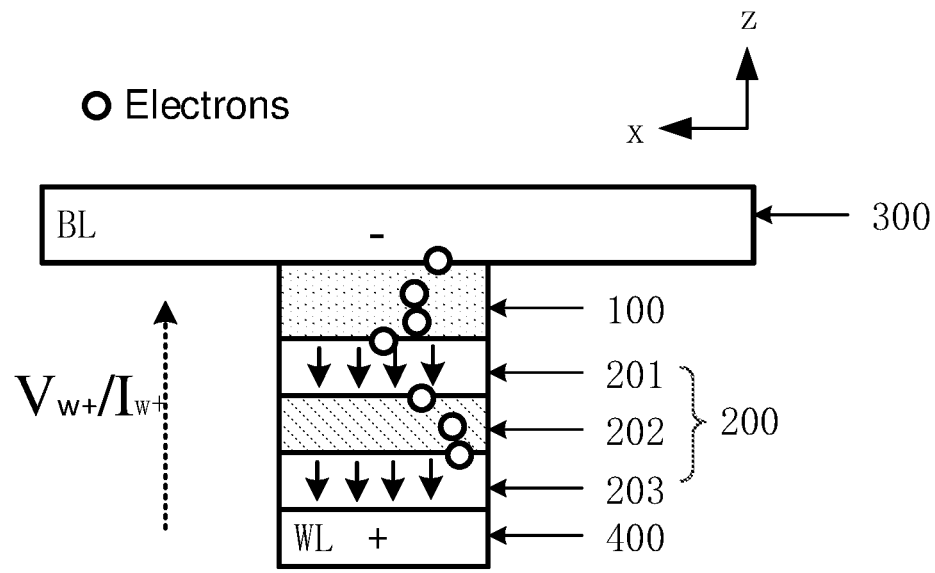
FIG. 7 is a schematic diagram of performing a write "0" operation on the memory unit shown in FIG. 6 according to an embodiment of the present disclosure.

FIG. 7 is a schematic diagram of performing a write "0" operation on the memory unit shown in FIG. 6 according to an embodiment of the present disclosure. Referring to FIG. 6 and FIG. 7, the first voltage $V_1$ is applied to the first surface of the selection memory unit through the word line 400, the second voltage $V_2$ is applied to the second surface of the selection memory unit through the bit line 300, and a value of a voltage drop generated by the first voltage $V_1$ and the second voltage $V_2$ on the selection storage unit is greater than a voltage value of a turn-on voltage of the two-dimensional material-based selector. The voltage drop generated on the selection memory unit is $V_{W+}$, the value of the voltage drop $V_{W+}$ may be, for example, 1 V, and a current corresponding to the voltage is $I_{W+}$. The voltage drop $V_{W+}$ described above enables the two-dimensional material-based selector to be turned on, electrons in the bit line 300 are first injected into the reference layer 201, and the current passing through the reference layer 201 generates a spin current. The spin current passes through the barrier layer 202 to be injected into the adjacent free layer 203. A spin moment is transferred to the free layer 203, so as to convert a magnetization direction of the free layer 203 to be the same as a magnetization direction of the reference layer 201, so that the magnetic tunnel junction (MTJ) 200 exhibits a low resistance state, and the write "0" operation may be realized.

Figure 8:
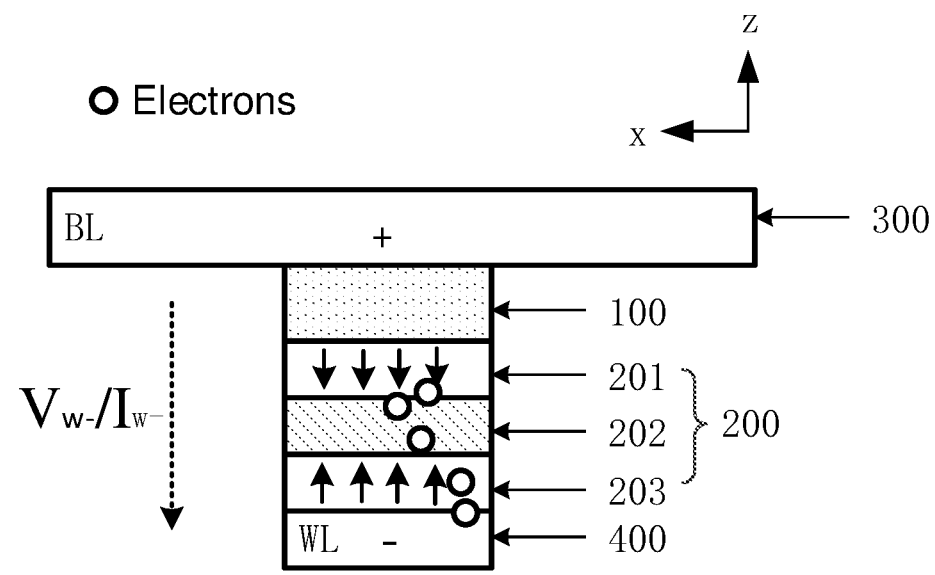
FIG. 8 is a schematic diagram of performing a write "1" operation on the memory unit shown in FIG. 6 according to an embodiment of the present disclosure.

FIG. 8 is a schematic diagram of performing a write "1" operation on the memory unit shown in FIG. 6 according to an embodiment of the present disclosure. Referring to FIG. 6 and FIG. 8, the first voltage $V_1$ is applied to the first surface of the selection memory unit through the word line 400, the second voltage $V_2$ is applied to the second surface of the selection memory unit through the bit line 300, and a value of a voltage drop generated by the first voltage $V_1$ and the second voltage $V_2$ on the selection storage unit is greater than a voltage value of a turn-on voltage of the two-dimensional material-based selector. The voltage drop generated on the selection memory unit is $V_{W-}$, the value of the voltage drop $V_{W-}$ may be, for example, 1 V, and a current corresponding to the voltage is $I_{W-}$. Electrons in the word line 400 are first injected into the free layer 203 in the magnetic tunnel junction 200, and a current magnitude and a polarization are unchanged at this point. When the current passes through the barrier layer 202 in the middle and reaches the reference layer 201, electrons having a spin magnetic moment direction opposite to a spin magnetic moment direction of the reference layer 201 are reflected back to the free layer 203 and the spin moment is transferred to the free layer 203, thereby switching a magnetization direction of the free layer 203, which will be anti-parallel to a magnetization direction of the reference layer 201, so that the magnetic tunnel junction 200 exhibits a high resistance state, and the write "1" operation may be realized.

Figure 9:
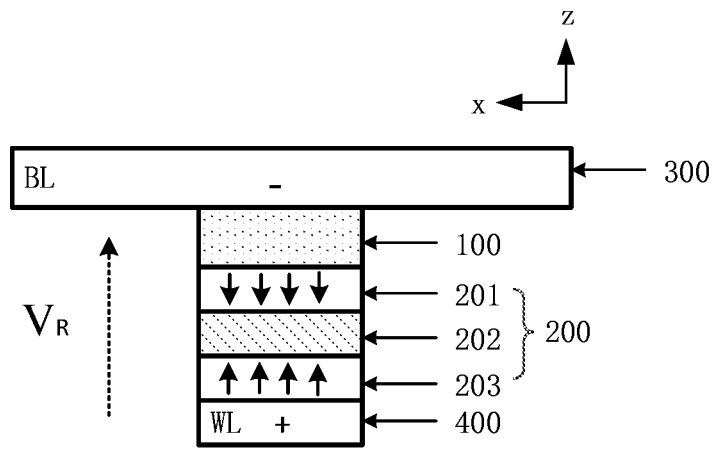
FIG. 9 is a schematic diagram of performing a read operation on the memory unit shown in FIG. 6 according to an embodiment of the present disclosure.

FIG. 9 is a schematic diagram of performing a read operation on the memory unit of FIG. 6 according to an embodiment of the present disclosure. Referring to FIG. 6 and FIG. 9, the first voltage $V_1$ is applied to the first surface of the selection memory unit through the word line 400, the second voltage $V_2$ is applied to the second surface of the selection memory unit through the bit line 300, and a value of a voltage drop generated by the first voltage $V_1$ and the second voltage $V_2$ on the selection storage unit is greater than a voltage value of a turn-on voltage of the two-dimensional material-based selector. The voltage drop generated on the selection memory unit is $V_R$, and a value of the voltage drop $V_R$ may be, for example, 0.7 V to 0.8 V, so that the two-dimensional material-based selector is turned on to form a conductive channel. Currents passing through different resistance states have different current magnitudes $I_R$, and reading of the storage information "0" state and "1" state may be realized by measuring an output current magnitude $I_R$.

FIG. 10 is a schematic diagram of an equivalent circuit after the of the two-dimensional material-based selector according to an embodiment of the present disclosure is turned on. Referring to FIG. 10, two stacked stack units form a structure connected in reverse series when the first selector 100 according to the embodiment is turned on, wherein the first stack unit 100a and the second stack unit 100b are equivalent to two diodes connected in reverse series in a circuit, and by connecting the first selector 100 in series with the magnetic tunnel junction 200, the read and write operations for the magnetic tunnel junction 200 may be realized by applying a voltage V or a current I that may enable the first selector 100 to be turned-on.

A fourth exemplary embodiment of the present disclosure provides another two-dimensional material-based selector.

In order to distinguish from the first selector of the first embodiment, the two-dimensional material-based selector of the present embodiment is described as the second selector. The second selector of the present embodiment is different from the first embodiment in that: the second selector of the present embodiment includes M stack units, where M≥2. Unlike the first embodiment, in each stack unit; an Ohmic contact is formed on one of two interfaces, a Schottky contact is formed on the other one of the two interfaces, and the M stack units include M Schottky diode structures connected in reverse parallel.

Figure 11:
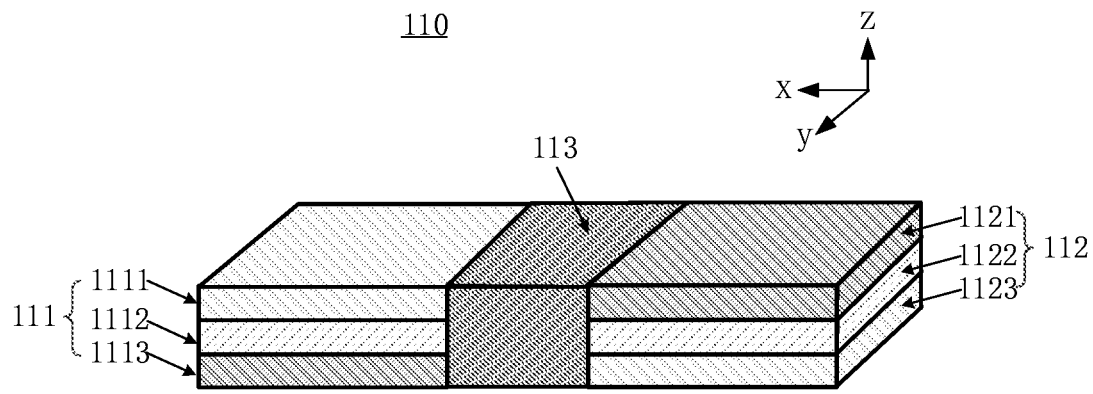
FIG. 11 is a schematic structural diagram of a two-dimensional material-based selector according to another embodiment of the present disclosure.

FIG. 11 is a schematic structural diagram of a two-dimensional material-based selector according to another embodiment of the present disclosure.

Referring to FIG. 11, the second selector 110 of the present embodiment includes: M stack units, where M≥2, and each stack unit has a metal-two-dimensional semiconductor-metal (M-S-M) structure.

In the present embodiment, the second selector 110 including two stack units is taken as an example. The two stack units are described as a first stack unit 111 and a second stack unit 112, respectively. The M-S-M structure of the present embodiment is the same as that of the first embodiment, including: a two-dimensional semiconductor layer, and metal layers arranged on an upper surface and a lower surface of the two-dimensional semiconductor layer, respectively. In the embodiment, at least two stack units are arranged in a direction parallel to a surface on which the two-dimensional semiconductor layer is located, which is described here as a second direction perpendicular to the first direction, and the second direction is exemplified as a direction along an x-axis in FIG. 11. An insulation layer 113 is arranged between sidewalls of two adjacent stack units in the M stack units. Referring to FIG. 11, the insulation layer 113 is arranged between the first stack unit 111 and the second stack unit 112.

Referring to FIG. 11, the first stack unit 111 includes: a first two-dimensional semiconductor layer 1112, a third metal layer 1111 arranged on an upper surface of the first two-dimensional semiconductor layer 1112, and a fifth metal layer 1113 arranged on a lower surface of the first two-dimensional semiconductor layer 1112; the second stack unit 112 includes: a second two-dimensional semiconductor layer 1122, a fourth metal layer 1121 arranged on an upper surface of the second two-dimensional semiconductor layer 1122, and a sixth metal layer 1123 arranged on a lower surface of the second two-dimensional semiconductor layer 1122. In each stack unit, an Ohmic contact is formed on a metal-two-dimensional semiconductor interface, and a Schottky contact is formed on a metal-two-dimensional semiconductor interface. The first stack unit 111 and the second stack unit 112 may be equivalent to two Schottky diode structures connected in reverse parallel in a circuit when the two-dimensional material-based selector is turned on.

Figure 17:
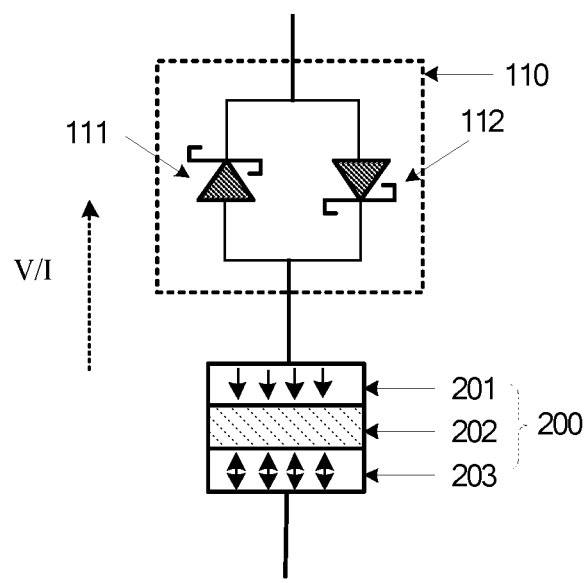
FIG. 17 is an equivalent circuit diagram of a two-dimensional material-based selector after being turned on according to another embodiment of the disclosure.

For example, in the first stack unit 111, an Ohmic contact is formed on an interface between the third metal layer 1111 and the first two-dimensional semiconductor layer 1112, and a Schottky contact is formed on an interface between the fifth metal layer 1113 and the first two-dimensional semiconductor layer 1112. Correspondingly, in the second stack unit 112, a Schottky contact is formed on an interface between the fourth metal layer 1121 and the second two-dimensional semiconductor layer 1122, and an Ohmic contact is formed on an interface between the sixth metal layer 1123 and the second two-dimensional semiconductor layer 1122. FIG. 17 shows an equivalent circuit diagram after the two-dimensional material-based selector is turn on. After applying an external voltage to the second selector 110 to enable the second selector 110 to be turned-on, the first stack unit 111 and the second stack unit 112 may be equivalent to two Schottky diode structures connected in reverse parallel in a circuit. The condition of arranging a plurality of stack units in the second direction may be deduced in a same manner.

Figure 12:
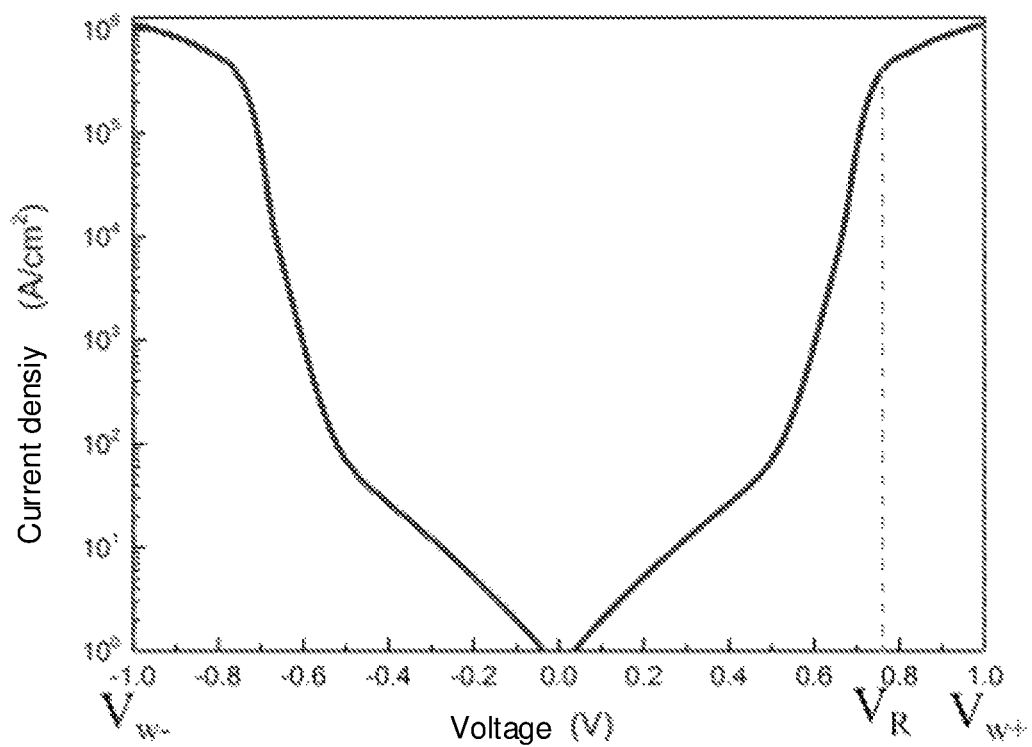
FIG. 12 is a volt-ampere characteristic curve of a two-dimensional material-based selector according to another embodiment of the present disclosure.

FIG. 12 is a volt-ampere characteristic curve of a two-dimensional material-based selector according to another embodiment of the present disclosure. Referring to FIG. 12, the volt-ampere characteristic curve of the two-dimensional material-based selector including two stack units connected in reverse parallel in the present embodiment is symmetrical, and the two-dimensional material-based selector has ovonic conducting switching characteristics. Specifically, referring to FIG. 12, the volt-ampere characteristic curve corresponding to an applying of a positive voltage and a negative voltage is symmetrical. As a value of the applied voltage is gradually increased, a current density is gradually increased, an amplitude of the increase is larger, and a tangent slope corresponding to the volt-ampere characteristic curve is gradually increased. When a forward voltage $V_{W+}$ (e.g., 1V) and a reverse voltage $V_{W-}$ (e.g., −1V) are applied, the two-dimensional material-based selector has a current density greater than $10^6$ A/cm², and when the forward voltage of 0.5V ($V_{W+}/2$) is applied, the two-dimensional material-based selector has a current density of $10^2$ A/cm² with an on-off ratio of $10^4$. The voltage $V_{W+}$ described above may correspond to a voltage for a programming operation. Correspondingly, FIG. 12 further shows a voltage $V_R$ corresponding to performing a read operation, a value of the voltage $V_R$ is less than the voltage $V_{W+}$.

A fifth exemplary embodiment of the present disclosure provides a memory unit, and a method of operating the memory unit. In the embodiment, in order to distinguish from the first memory unit described in the second embodiment, the memory unit of the embodiment is referred to as the second memory unit. The memory unit in the embodiment differs from the memory unit of the first embodiment in that the structure of the two-dimensional material-based selector is changed.

Figure 13:
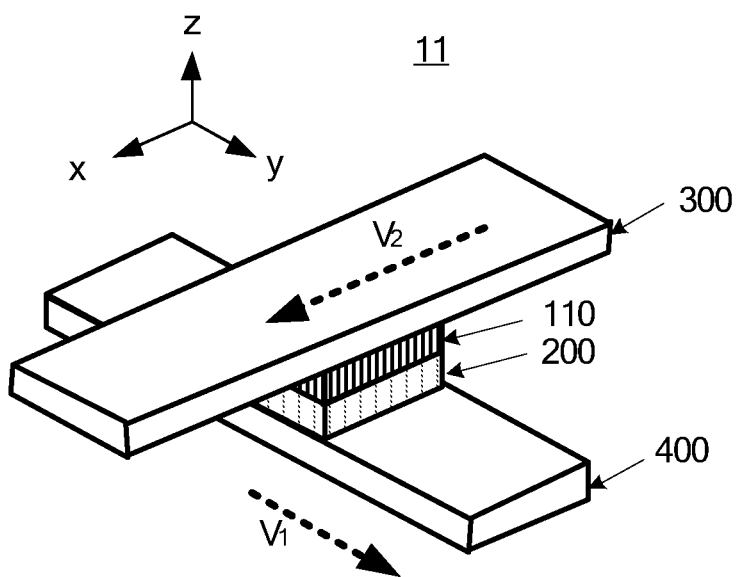
FIG. 13 is a schematic diagram of a structure of a memory unit and performing an operation on the memory unit according to another embodiment of the disclosure.

FIG. 13 shows a schematic diagram of a structure of a memory unit and performing an operation on the memory unit according to another embodiment of the present disclosure.

Referring to FIG. 13, the second memory unit 11 of the embodiment includes: a two-dimensional material-based selector, wherein the two-dimensional material-based selector in the present embodiment is the second selector 110 shown in the fourth embodiment; and a magnetic tunnel junction 200. The second selector 110 and the magnetic tunnel junction 200 are stacked in the first direction (z direction) to form a selection storage unit, and an on-off of the second selector 110 in the selection memory unit may be used to control a read operation and a write operation of the magnetic tunnel junction 200. The selection storage unit includes a first surface (corresponding to a lower surface in FIG. 13) and a second surface (corresponding to an upper surface in FIG. 13) oppositely arranged in the first direction, the first surface is used for connecting with a word line 400, and the second surface is used for connecting with a bit line 300.

In some embodiments, the second memory unit 11 may also be a structure including the bit line 300 and the word line 400.

The magnetic tunnel junction 200 in the embodiment is the same as the content in the first embodiment, which will not be described in detail here.

The method of operating the memory unit in the embodiment is described below in combination with FIG. 12 to FIG. 16. The method of the embodiment is the same as the method of operating the memory unit described in the third embodiment, except for the structure of the two-dimensional material-based selector (the second selector) in the embodiment is different from the structure of the first selector in the third embodiment.

Figure 14:
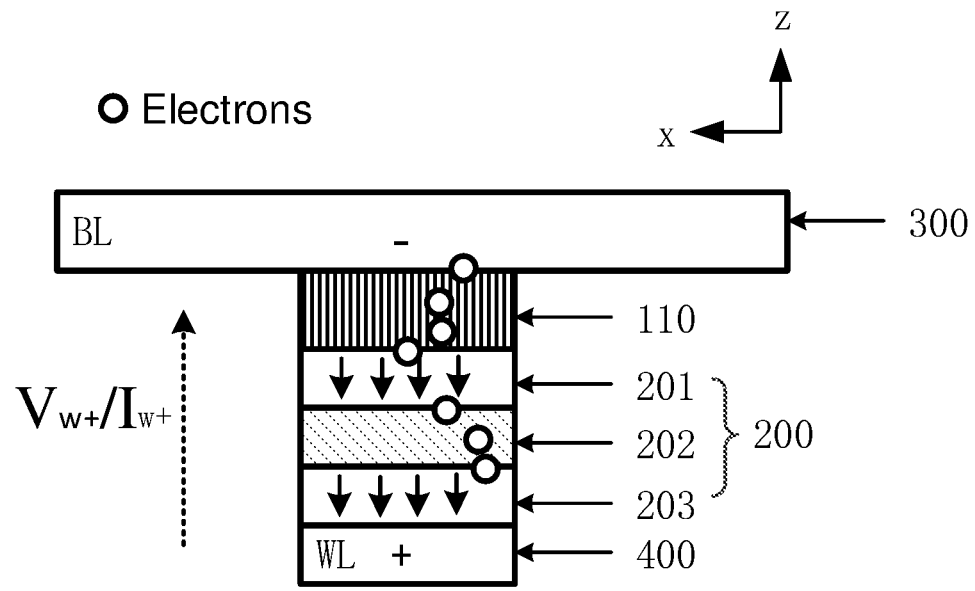
FIG. 14 is a schematic diagram of performing a write "0" operation on the memory unit shown in FIG. 13 according to another embodiment of the present disclosure.
Figure 15:
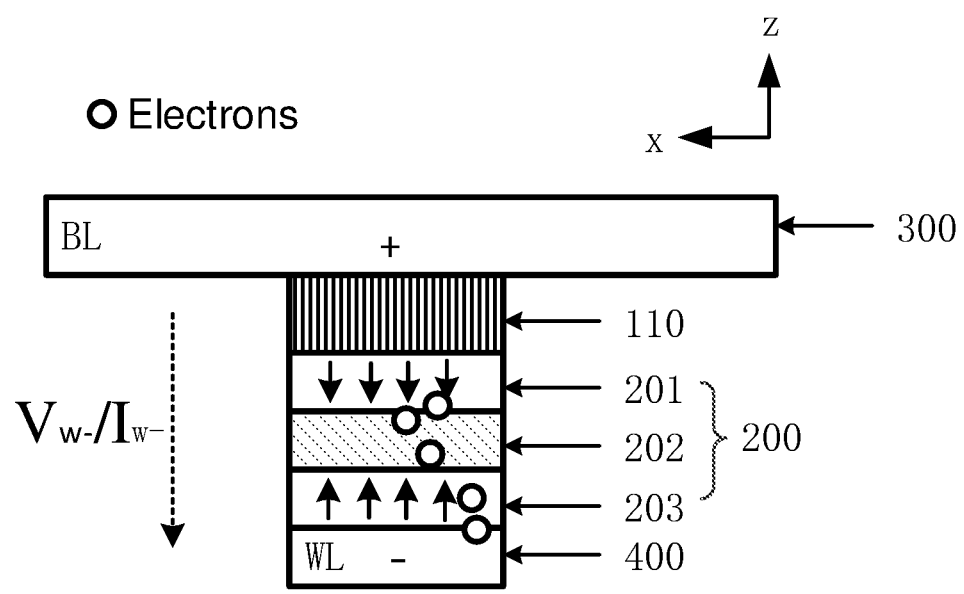
FIG. 15 is a schematic diagram of performing a write "1" operation on the memory unit shown in FIG. 13 according to another embodiment of the present disclosure.
Figure 16:
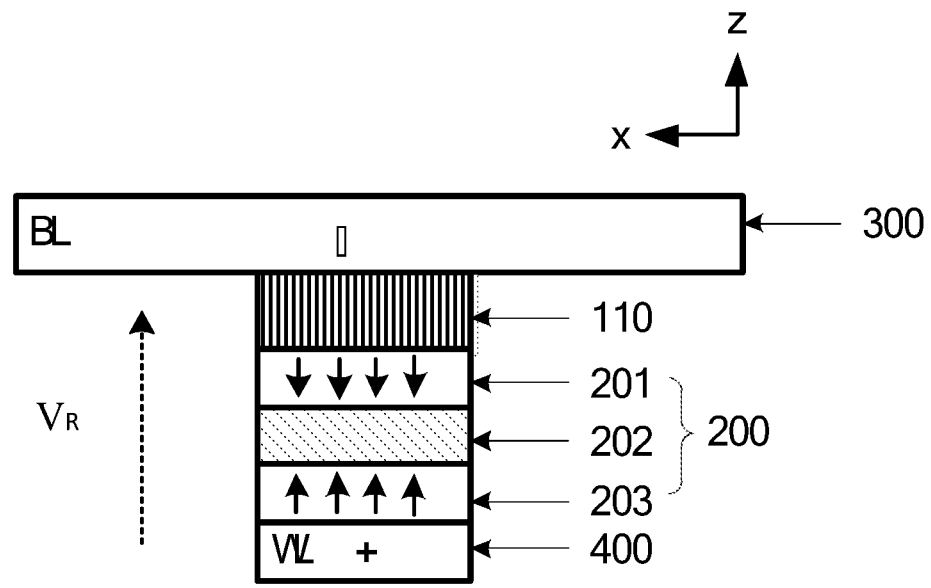
FIG. 16 is a schematic diagram of performing a read operation on the memory unit shown in FIG. 13 according to another embodiment of the present disclosure.

FIG. 14 is a schematic diagram of performing a write "0" operation on the memory unit shown in FIG. 13 according to another embodiment of the present disclosure. FIG. 15 is a schematic diagram of performing a write "1" operation on the memory unit shown in FIG. 13 according to another embodiment of the present disclosure. FIG. 16 shows a schematic diagram of performing a read operation on the memory unit shown in FIG. 13 according to another embodiment of the present disclosure.

Referring to FIG. 13, in the embodiment, the first voltage $V_1$ is applied to the word line 400, and the second voltage $V_2$ is applied to the bit line 300, the directions in which the first voltage and the second voltage applied shown in FIG. 12 are exemplary only, and the magnitudes of the first voltage and the second voltage described in the embodiment may be equal or may not be equal to the magnitudes of the first voltage and the second voltage described in the preceding embodiments.

Referring to FIG. 13 and FIG. 14, the first voltage $V_1$ is applied to the first surface of the selection memory unit through the word line 400, the second voltage $V_2$ is applied to the second surface of the selection memory unit through the bit line 300, and a value of a voltage drop generated by the first voltage $V_1$ and the second voltage $V_2$ on the selection storage unit is greater than a voltage value of a turn-on voltage of the two-dimensional material-based selector 110. The voltage drop generated on the selection memory unit is $V_{W+}$, the value of the voltage drop $V_{W+}$ may be, for example, 1 V, and a current corresponding to the voltage is $I_{W+}$. The voltage drop $V_{W+}$ described above enables the two-dimensional material-based selector 110 to be turned on, electrons in the bit line 300 are first injected into the reference layer 201, and the current passing through the reference layer 201 generates a spin current. The spin current passes through the barrier layer 202 to be injected into the adjacent free layer 203. A spin moment is transferred to the free layer 203, so as to convert a magnetization direction of the free layer 203 to be the same as a magnetization direction of the reference layer 201, so that the magnetic tunnel junction (MTJ) 200 exhibits a low resistance state, and the write "0" operation may be realized.

Referring to FIG. 13 and FIG. 15, the first voltage $V_1$ is applied to the first surface of the selection memory unit through the word line 400, the second voltage $V_2$ is applied to the second surface of the selection memory unit through the bit line 300, and a value of a voltage drop generated by the first voltage $V_1$ and the second voltage $V_2$ on the selection storage unit is greater than a voltage value of a turn-on voltage of the two-dimensional material-based selector 110. The voltage drop generated on the selection memory unit is $V_{W-}$, the value of the voltage drop $V_{W-}$ may be, for example, 1 V, and a current corresponding to the voltage is $I_{W-}$. Electrons in the word line 400 are first injected into the free layer 203 in the magnetic tunnel junction 200, and a current magnitude and a polarization are unchanged at this point. When the current passes through the barrier layer 202 in the middle and reaches the reference layer 201, electrons having a spin magnetic moment direction opposite to a spin magnetic moment direction of the reference layer 201 are reflected back to the free layer 203 and the spin moment is transferred to the free layer 203, thereby switching a magnetization direction of the free layer 203, which will be anti-parallel to a magnetization direction of the reference layer 201, so that the magnetic tunnel junction 200 exhibits a high resistance state, and the write "1" operation may be realized.

Referring to FIG. 13 and FIG. 16, the first voltage $V_1$ is applied to the first surface of the selection memory unit through the word line 400, the second voltage $V_2$ is applied to the second surface of the selection memory unit through the bit line 300, and a value of a voltage drop generated by the first voltage $V_1$ and the second voltage $V_2$ on the selection storage unit is greater than a voltage value of a turn-on voltage of the two-dimensional material-based selector 110. The voltage drop generated on the selection memory unit is $V_R$, and a value of the voltage drop $V_R$ may be, for example, 0.7 V to 0.8 V, including end point values, so that the two-dimensional material-based selector is turned on to form a conductive channel. Currents passing through different resistance states have different current magnitudes $I_R$, and reading of the storage information "0" state and "1" state may be realized by measuring an output current magnitude $I_R$.

A sixth exemplary embodiment of the present disclosure provides a memory array and a method of operating the memory array.

Figure 18:
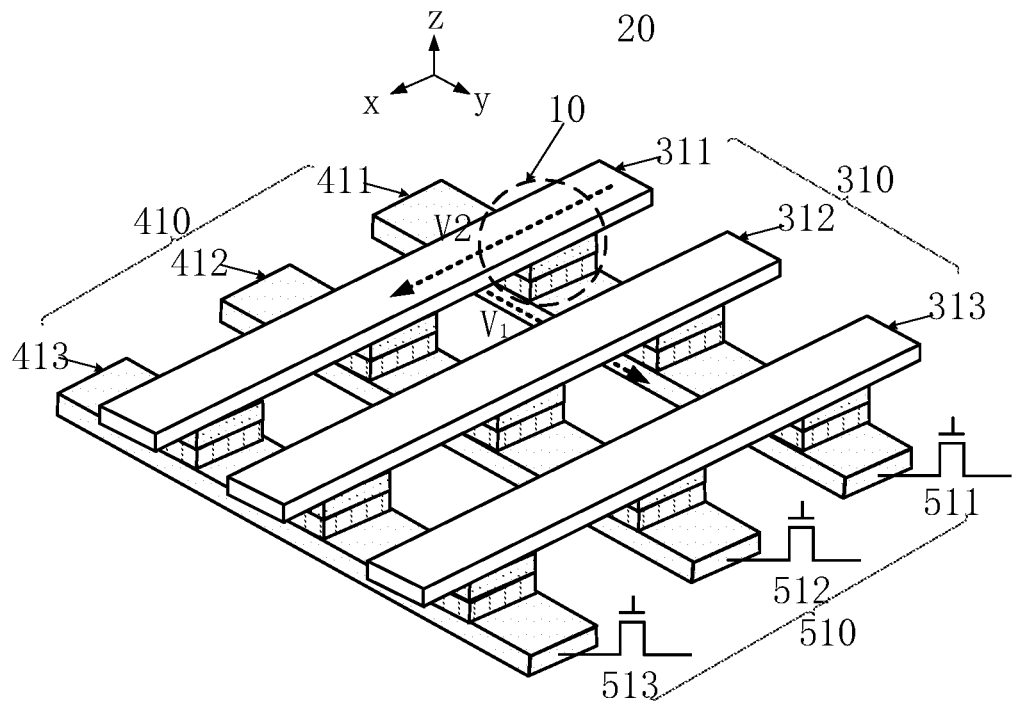
FIG. 18 is a schematic structural diagram of a two-dimensional memory array according to an embodiment of the present disclosure.
Figure 19:
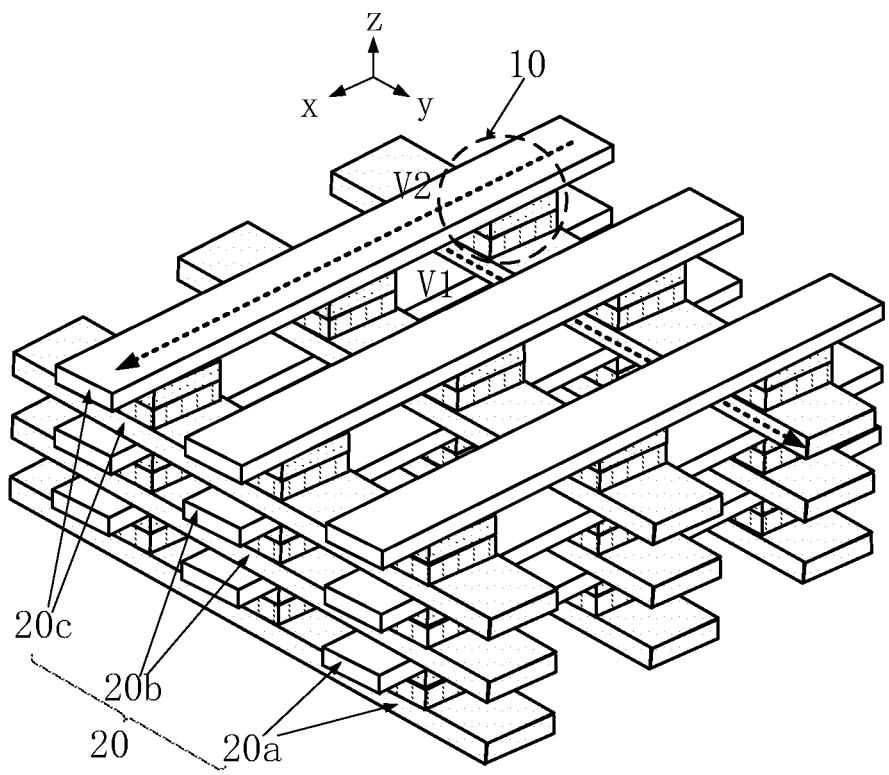
FIG. 19 is a schematic structural diagram of a three-dimensional memory array according to an embodiment of the present disclosure.

FIG. 18 is a schematic structural diagram of a two-dimensional memory array according to an embodiment of the present disclosure. FIG. 19 is a schematic structural diagram of a three-dimensional memory array according to an embodiment of the present disclosure.

Referring to FIG. 18 and FIG. 19, the memory array of the embodiment includes: at least one layer of cross storage array 20.

Referring to FIG. 18, the memory array may be a two-dimensional memory array that includes only one layer of cross memory array 20. The layer of cross memory array 20 includes: a bit line array 310, a word line array 410, and a plurality of memory units arranged at intersections of the bit line array 310 and the word line array 410, each of which may be the first memory unit 10 or the second memory unit 11 described in the embodiments described above. In the first memory unit 10/the second memory unit 11, the first selector 100/the second selector 110 and the magnetic tunnel junction 200 are stacked in the first direction (z direction) to form a selection memory unit.

The bit line array 310 may include m word lines arranged in parallel in a second direction (x direction), where m is a positive integer greater than or equal to 2. The word line array 410 may include n word lines arranged in parallel in a third direction (y direction), where n is a positive integer greater than or equal to 2. The third direction (y direction) is perpendicular to the first direction (z direction), and an angle between the third direction and the second direction (x direction) may be 90° or other suitable angles, such as a value between 60° and 120°, including end point values. The bit line array 310 and the word line array 410 form m×n intersections, and there is a total of m×n memory units at the intersections. Each memory unit is connected between a bit line and a word line at the intersection.

FIG. 18 schematically shows the two-dimensional memory array is a 3×3 array, wherein the bit line array 310 is illustrated by 3 bit lines, i.e., a first bit line 311, a second bit line 312 and a third bit line 313, and the word line array 410 is illustrated by 3 word lines, i.e., a first word line 411, a second word line 412 and a third word line 413.

In an embodiment, the two-dimensional memory array described above further includes: a selection transistor 510 connected in series with each word line of the plurality of word lines in each layer of cross storage array, and is used to control an on-off of the word line. Referring to FIG. 18, a first selection transistor 511 is connected in series to the first word line 411, and the first selection transistor 511 is used to control the on-off of the first word line 411. A second selection transistor 512 is connected in series to the second word line 412, and the second selection transistor 512 is used to control the on-off of the second word line 412. A third selection transistor 513 is connected in series to the third word line 413, and the third selection transistor 513 is used to control the on-off of the third word line 413.

The method of operating the two-dimensional memory array will be described below.

The selection storage unit to be operated is positioned. For example, in the example of FIG. 18, the selection storage unit encircled by a dotted circle is positioned with a coordinate of (1, 1, 1). FIG. 18 illustrates a structure of the selection memory unit in the first memory unit 10, and the selection storage unit described above may also be the selection storage unit in the second memory unit 11. The positioning method may be to address a word line and a bit line corresponding to the selection storage unit. The operation described above includes at least one of a write operation and a read operation.

The first voltage $V_1$ is applied to a word line on which the selection storage unit to be operated is located, and the second voltage $V_2$ is applied to a bit line on which the selection storage unit to be operated is located. As shown in FIG. 18, the first voltage $V_1$ is applied to the first word line 411 on which the selection storage unit with the coordinate of (1, 1, 1) is located, and the second voltage $V_2$ is applied to the first bit line 311 on which the selection storage unit with the coordinate of (1, 1, 1) is located. Directions of the first voltage and the second voltage shown in FIG. 18 are exemplary only. It should be noted that the first voltage and the second voltage described in the embodiment may be equal to or different from the first voltage and the second voltage described in the preceding embodiments. A value of a voltage drop generated by the first voltage $V_1$ and the second voltage $V_2$ on the selection storage unit to be operated is greater than a voltage value of a turn-on voltage $V_{on}$ of the two-dimensional material-based selector on the selection storage unit, so that an operation may be performed on the magnetic tunnel junction in the selection storage unit to be operated. In an embodiment, a control of the turning on of the word line may be realized by controlling the on-off of the selection transistor connected in series with the word line.

A zero voltage is applied to the remaining word lines and the remaining bit lines. A voltage drop generated on the remaining selection storage units with coordinates of (2, 1, 1) and (3, 1, 1) located on the same bit line (the first bit line 311) as the selection storage unit with the coordinate (1, 1, 1) is: $V_2$, and a voltage drop generated on the remaining selection storage units with coordinates of (1, 2, 1) and (1, 3, 1) located on the same word line (the first word line 411) as the selection storage unit with the coordinate (1, 1, 1) is: $V_1$. In order to make the voltage drop generated on the remaining selection storage units not enough to turn on the two-dimensional material-based selector in the other selection storage units, according to electrical characteristics of the first selector or the second selector described in the preceding embodiments, the voltage value of the first voltage and the voltage value of the second voltage may be set to be less than or equal to $V_{on}/2$, and the voltage drops of other selection storage units located on the same word line or the same bit line as the selection storage unit to be operated that do not need to be operated may meet: causing the two-dimensional material-based selectors in other selection storage units to be in an off state. In an embodiment, a zero voltage may be applied to the bit line, so as to realize an effect of applying a zero voltage to the word line by controlling the selection transistor on the word line to be in an off state.

A value of the voltage drop for performing the write operation is greater than a value of the voltage drop for performing the read operation. For example, in an embodiment, the voltage drop for performing the write operation is 1 V (see FIG. 12), and the voltage drop for performing the read operation is 0.6 V-0.8 V (see FIG. 12).

Referring to FIG. 19, in order to increase a storage density, the memory array may also be a three-dimensional memory array that includes a plurality of layers of cross memory array 20. The three-dimensional memory array may be obtained by stacking a plurality of the two-dimensional memory arrays 20 described above in the first direction (z-axis direction). Referring to FIG. 19, taking three layers of cross memory array as an example, the three layers of cross memory array 20 is, from bottom to top: a first cross memory array 20a, a second cross memory array 20b, and a third cross memory array 20c. In the three-dimensional memory array, each layer of cross memory array 20 may be the same as the two-dimensional memory array shown in FIG. 18, and may include a selection transistor connected to the word line.

An insulation layer is arranged between two adjacent layers of cross storage array in the plurality of layers of cross storage array. In the embodiment, the insulation layer (not shown in FIG. 19) is arranged between intersections of the word line array of the cross memory array of the upper layer and the bit line array of the cross memory array of the lower layer.

The method of operating the three-dimensional memory array is the same as the method of operating the two-dimensional memory array, which will be briefly described below with reference to FIG. 19.

A selection storage unit to be operated is positioned. Referring to FIG. 19, the selection storage unit with coordinate of (1, 1, 3) is positioned. The positioning method may be to address a word line and a bit line corresponding to the selection memory unit. The operation described above includes at least one of a write operation and a read operation.

Referring to FIG. 19, the first voltage $V_1$ is applied to a word line on which the selection storage unit to be operated is located, and the second voltage $V_2$ is applied to a bit line on which the selection storage unit to be operated is located. A value of a voltage drop generated by the first voltage $V_1$ and the second voltage $V_2$ on the selection storage unit to be operated is greater than a voltage value of a turn-on voltage $V_{on}$ of the two-dimensional material-based selector, so that an operation may be performed on the magnetic tunnel junction in the selection storage unit to be operated.

A zero voltage is applied to the remaining word lines and the remaining bit lines. Referring to FIG. 19, for the three-dimensional memory array 30, it includes not only selection storage units located on the same word line and the same bit line as the selection storage unit to be operated that do not need to be operated, but also selection storage units located on a different word line and a different bit line from the selection storage unit to be operated that do not need to be operated.

By applying a zero voltage to the remaining word lines and the remaining bit lines, the voltage drops of other selection storage units in different word lines and different bit lines from (1, 1, 3) that do not need to be operated to be lowered to zero. Corresponding coordinates of the selection storage units whose voltage drop is zero are (1, 1, 2), (1, 2, 2), (1, 3, 2), (2, 1, 2), (2, 2, 2), (2, 3, 2), (3, 1, 2), (3, 2, 2), (3, 3, 2), (1, 1, 1), (1, 2, 1), (1, 3, 1), (2, 1, 1), (2, 2, 1), (2, 3, 1), (3, 1, 1), (3, 2, 1), (3, 3, 1), (2, 2, 3), (2, 3, 3), (3, 2, 3), (3, 3, 3).

A voltage drop generated on the remaining selection storage units with coordinates of (2, 1, 3) and (3, 1, 3) located on the same bit line as the selection storage unit with the coordinate (1, 1, 3) is: $V_2$, and a voltage drop generated on the remaining selection storage units with coordinates of (1, 2, 3) and (1, 3, 3) located on the same word line as the selected storage unit with the coordinate (1, 1, 3) is: $V_1$. In order to make the voltage drop generated on the remaining selection storage units not enough to turn on the two-dimensional material-based selector in the other selection storage units, according to electrical characteristics of the first selector or the second selector described in the preceding embodiments, the voltage value of the first voltage and the voltage value of the second voltage may be set to be less than or equal to $V_{on}/2$, and the voltage drops of other selection storage units located on the same word line or the same bit line as the selection storage unit to be operated that do not need to be operated may meet: causing the two-dimensional material-based selectors in other selection storage units to be in an off state.

In an embodiment of the present disclosure, a value of the voltage drop for performing the write operation is greater than a value of the voltage drop for performing the read operation. For example, in an embodiment, the voltage drop for performing the write operation is 1 V (see FIG. 12), and the voltage drop for performing the read operation is 0.6 V-0.8 V (see FIG. 12).

In the embodiments of the present disclosure, shapes of the memory unit and the selector may be replaced with cylindrical, annular and other shapes or deformed into other shapes, and are not limited to the embodiments and the examples of the drawings. The material of the two-dimensional semiconductor material may be replaced with a two-dimensional material having the same physical and electrical characteristics as $WSe_2$, $WS_2$, $MoS_2$, and the like. The technical features of the above embodiments may be combined with each other to form new embodiments, which are also within the protection scope of the present disclosure.

In summary, the two-dimensional material-based selector provided by the embodiments of the present disclosure may realize high-speed and reliable ovonic conduction turn-on with the turn-on voltage of less than 1 V, and a pA level leakage current, while having a high turn-on current density (greater than $10^6$ $A/cm^2$) and a higher nonlinearity (with an on-off ratio is greater than $10^3$). The two-dimensional material-based selector may be used as the switch of the magnetic tunnel junction in the magnetic memory unit, so as to realize quick read and write operations of the STT-MRAM. In an operation of the two-dimensional or three-dimensional memory array composed of the magnetic memory unit described above, based on the high on-off ratio of the two-dimensional material-based selector, the corresponding current is extremely small ($10^3$ $A/cm^2$) for storage units that are not selected (in an off state). An arrangement of the two-dimensional material-based selector described above significantly suppresses the leakage current generated by other memory units on the same word line or the same bit line as the selected memory unit.

From the technical solutions described above, the two-dimensional material-based selector, the memory unit, the array and the method of manufacturing the same provided in the present disclosure have at least the following beneficial effects:

(1) By arranging the metal-two-dimensional semiconductor-metal structure, two Schottky junctions may be formed at the two metal-two-dimensional semiconductor interfaces. After the two-dimensional material-based selector is turned on by applying a voltage, the two Schottky junctions are in a reverse series connection structure, and the formed reverse series connected Schottky diode structure has ovonic conducting switching characteristics, with a smaller turn-on voltage (0.8 V to 1.2 V) and a pA level leakage current, and further with a high turn-on current density (greater than $10^6$ $A/cm^2$) and a higher nonlinearity (with an on-off ratio is greater than $10^3$), and thus has excellent switching characteristics as a selection switch.

(2) By arranging at least two stack structures to be parallel to a plane on which the two-dimensional semiconductor is located, and arranging an insulation layer to be located between the two stack structures, each stack unit includes a metal-two-dimensional semiconductor interface forming an Ohmic contact and a metal-two-dimensional semiconductor interface forming a Schottky contact. After the two-dimensional material-based selector is turned-on by applying a voltage, at least two stack structures form a structure of a plurality of Schottky diodes connected in reverse parallel, which has a smaller turn-on voltage (0.8 V to 1.2 V) and a pA level leakage current, and also has a higher turn-on current density (greater than $10^6$ $A/cm^2$) and a higher nonlinearity (with an on-off ratio is greater than $10^3$), and thus has an excellent switching characteristics as the selection switch.

(3) The two-dimensional material-based selector is respectively connected with each magnetic tunnel junction in series to form a selection storage unit of one selector and one magnetic tunnel junction (1S-1M). Due to the fact that the off-state leakage current (about 1 pA) of the two-dimensional material-based selector is small, when the read or write operation is performed on a memory unit, other storage units are almost in an off-state, which may reduce an amplitude of the leakage current, and greatly reduce a power consumption of the three-dimensional STT-MRAM array. An ultrathin two-dimensional material has a low turn-on voltage of 1 V, exhibits a high nonlinearity and an extremely high turn-on current (more than $10^6$ $A/cm^2$) when the selector is turned on, which may quickly drive the free layer in the storage unit to switch the magnetization direction, and improve the switching speed (<10 ns) of the three-dimensional memory array.

(4) A two-dimensional van der Waals material may be made into a few layers or even a single-layer structure with a thickness of about 1 nm. Compared with the selector manufactured by a transistor, a series diode, a common ovonic conducting switch and the like, the two-dimensional van der Waals material has a smaller thickness size, and provides favorable conditions for high-density integration.

It should be noted that in the drawings or the description, the same reference numerals are used for similar or identical parts. Implementations not shown or described in the drawings are of forms known to those of ordinary skill in the art. Additionally, although the present disclosure may provide examples of parameters including particular values. It should be understood that the parameters need not be exactly equal to the corresponding values, but may be approximated within acceptable error margins or design constraints. Directional terms mentioned in the embodiments, such as "upper", "lower", "front", "rear", "left", "right", and the like, only refer to the directions of the drawings. Accordingly, the directional terms used are intended to be illustrative and are not intended to limit the scope of the present disclosure.

Furthermore, some conventional structures and components may be shown in a simple and schematic manner in the drawings for the purpose of neat and tidy of the drawings. In addition, some features in the drawings of the present disclosure may be slightly enlarged or changed in scale or size for the purpose of facilitating understanding and viewing of the technical features of the present disclosure. However, this is not intended to limit the present disclosure. The actual dimensions and specifications of the product manufactured according to the present disclosure may be adjusted according to the requirements during production, the characteristics of the product, and the contents disclosed in the following disclosure of the present disclosure as disclosed below. It is hereby declared.

Additionally, the use of ordinal numbers such as "first", "second" "third", and the like, in the description and the claims to modify corresponding elements does not mean that the elements have any ordinal numbers nor does it represent an order between one element and another element, or an order of a manufacturing method, and the use of the ordinal numbers is only used to distinguish one element having a certain name from another element having the same name.

The specific embodiments described above further explain the objectives, technical solutions and advantages of the present disclosure in detail. It should be understood that the specific embodiments described above are only specific embodiments of the present disclosure, and should not be used to limit the present disclosure, and any modifications, equivalents, improvements and the like made within the spirit and principle of the present disclosure should be included in the protection scope of the present disclosure.

What is claimed is:

1. A method of operating a memory unit, the memory unit comprising:
    a two-dimensional material-based selector and a magnetic tunnel junction;
    wherein the two-dimensional material-based selector comprises a stack unit, the stack unit has a metal-two-dimensional semiconductor-metal structure comprising a two-dimensional semiconductor layer and metal layers arranged on an upper surface and a lower surface of the two-dimensional semiconductor layer, respectively;
    wherein the stack unit comprises two Schottky diode structures connected in reverse series in response to the two-dimensional material-based selector being turned on; and
    wherein the two-dimensional material-based selector and the magnetic tunnel junction are stacked in a first direction to form a selection storage unit comprising a first surface and a second surface oppositely arranged in the first direction, the first surface is configured to be connected with a word line, and the second surface is configured to be connected with a bit line;
    wherein the method comprises:
        applying a first voltage to the first surface of the selection storage unit and applying a second voltage to the second surface of the selection storage unit, wherein a value of a voltage drop generated by the first voltage and the second voltage on the selection storage unit is greater than a voltage value of a turn-on voltage of the two-dimensional material-based selector, so that at least one of a read operation and a write operation is performed on the magnetic tunnel junction.

2. The method according to claim 1, wherein a value of the voltage drop for performing the write operation is greater than a value of the voltage drop for performing the read operation.

3. The method according to claim 1, wherein the two-dimensional material-based selector comprises M stack units, where M≥2;
    wherein each stack unit has a metal-two-dimensional semiconductor interface on which an Ohmic contact is formed, and another metal-two-dimensional semiconductor interface on which a Schottky contact is formed; and
    wherein the M stack units are arranged in a second direction parallel to a plane on which the two-dimensional semiconductor layer is located, an insulation layer is arranged between sidewalls of two adjacent stack units in the M stack units, and the M stack units comprise M Schottky diode structures connected in reverse parallel in response to the two-dimensional material-based selector is turned on.

4. The method according to claim 1, wherein the two-dimensional material-based selector comprises two or more stack units, and the two or more stack units are stacked in a first direction perpendicular to a plane on which the two-dimensional semiconductor layer is located.

5. The method according to claim 1, wherein a material of the two-dimensional semiconductor layer comprises one or a combination of WS2, WSe2 or MoS2.

6. The method according to claim 1, wherein the two-dimensional semiconductor layer has a thickness of 2 nm to 10 nm.

7. The method according to claim 1, wherein a material of the metal layer is a simple substance formed by one of the group consisting of Pt, Ta, W, Ir, Os, Re, Hf, Pd, Rh, Mo, Nb, Zr, Au, Tc, Cd, Pb and Sn, or an alloy formed by a plurality of materials selected from the group consisting of Pt, Ta, W, Ir, Os, Re, Hf, Pd, Rh, Mo, Nb, Zr, Au, Tc, Cd, Pb and Sn.

8. The method according to claim 1, wherein a volt-ampere characteristic curve of the two-dimensional material-based selector is symmetrical, and has an ovonic conducting switching characteristic.

9. The method according to claim 1, wherein:
    the two-dimensional material-based selector has a turn-on voltage of 0.8 V to 1.2 V; and/or
    the two-dimensional material-based selector has an on/off ratio not less than 103; and/or
    the two-dimensional material-based selector has a turn-on current density not less than 106 A/cm2.

10. The method according to claim 1, wherein the two-dimensional material-based selector is located above or below the magnetic tunnel junction in the first direction.

11. A method of operating a memory array, the memory array comprising:
    at least one layer of cross storage array, wherein each layer of cross storage array comprises:
    a bit line array comprising a plurality of bit lines arranged in parallel in a second direction;
    a word line array comprising a plurality of word lines arranged in parallel in a third direction perpendicular to a first direction, wherein an included angle is formed between the third direction and the second direction;
    a plurality of memory units arranged at intersections of the word line array and the bit line array, wherein each memory unit of the plurality of memory units comprises;
    a two-dimensional material-based selector and a magnetic tunnel junction;
    wherein the two-dimensional material-based selector comprises a stack unit, the stack unit has a metal-two-dimensional semiconductor-metal structure comprising a two-dimensional semiconductor layer and metal layers arranged on an upper surface and a lower surface of the two-dimensional semiconductor layer, respectively;
    wherein the stack unit comprises two Schottky diode structures connected in reverse series in response to the two-dimensional material-based selector being turned on; and
    wherein the two-dimensional material-based selector and the magnetic tunnel junction are stacked in the first direction to form a selection storage unit comprising a first surface and a second surface oppositely arranged in the first direction, the first surface is configured to be connected with a word line of the plurality of word lines, and the second surface is configured to be connected with a bit line of the plurality of bit lines;

wherein the method comprises:

positioning a selection storage unit to be operated;

applying a first voltage to a word line on which the selection storage unit to be operated is located, and applying a second voltage to a bit line on which the selection storage unit to be operated is located; and applying a zero voltage to a remaining word line and a remaining bit line;

wherein a value of a voltage drop generated by the first voltage and the second voltage on the selection storage unit to be operated is greater than a voltage value of a turn-on voltage of the two-dimensional material-based selector, so that at least one of a write operation and a read operation is performed on the magnetic tunnel junction in the selection storage unit to be operated; a voltage value of the first voltage and a voltage of the second voltage are less than or equal to half the turn-on voltage, so that a voltage drop on other selection storage units located on the same word line or the same bit line as the selection storage unit to be operated meets: enabling two-dimensional material-based selectors in the other selection storage units to be in an off state.

12. The method according to claim 11, wherein a value of the voltage drop for performing the write operation is greater than a value of the voltage drop for performing the read operation.

13. The method according to claim 11, wherein the memory array further comprises a selection transistor connected in series with each word line of the plurality of word lines in each layer of cross storage array, and is configured to control an on-off of the corresponding word line.

14. The method according to claim 11, wherein an insulation layer is arranged between two adjacent layers of cross storage array in the plurality of layers of cross storage array in response to the memory array comprising a plurality of layers of cross storage array.

* * * * *